(12) United States Patent
Yamaguchi et al.

(10) Patent No.: US 6,603,343 B2
(45) Date of Patent: Aug. 5, 2003

(54) PHASE CORRECTION CIRCUIT FOR TRANSISTOR USING HIGH-FREQUENCY SIGNAL

(75) Inventors: Mamiko Yamaguchi, Tokyo (JP); Yoshinobu Sasaki, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/171,983

(22) Filed: Jun. 17, 2002

(65) Prior Publication Data

US 2003/0112054 A1 Jun. 19, 2003

(30) Foreign Application Priority Data

Dec. 18, 2001 (JP) .......................... 2001-384257

(51) Int. Cl.[7] .......................... H03L 35/00; H03K 17/78
(52) U.S. Cl. .................................... 327/513
(58) Field of Search ................. 327/512, 513, 327/580, 584, 314, 317, 320, 325, 326

(56) References Cited

U.S. PATENT DOCUMENTS 3,584,233 A * 6/1971 Cath et al. .................. 327/362
5,617,048 A * 4/1997 Ward et al. .................. 327/143
6,278,313 B1 * 8/2001 Kakuta et al. ............... 327/317

FOREIGN PATENT DOCUMENTS

| JP | 3-258008 | 11/1991 |
| JP | 11-74367 | 3/1999 |
| JP | 1-137713 | 5/1999 |

* cited by examiner

Primary Examiner—My-Trang Nu Ton
(74) Attorney, Agent, or Firm—Leydig, Voit & Mayer, Ltd.

(57) ABSTRACT

In order to stabilize a phase of an output signal of a transistor, a phase correction circuit includes: a) a circuit element connected in parallel to a gate of the transistor, an impedance including a reactance changing in response to a potential difference; and b) a voltage control circuit to decrease the reactance component in response to the increase in potential of the gate, wherein total reactance component of the circuit element and the transistor is maintained to a predetermined value. Because of the function of the phase correction circuit, another circuit using the output signal of the transistor can work correctly.

4 Claims, 6 Drawing Sheets

Fig.12A    Fig.12B
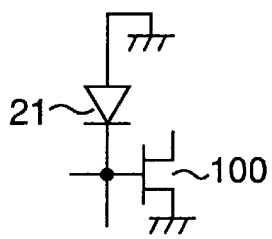
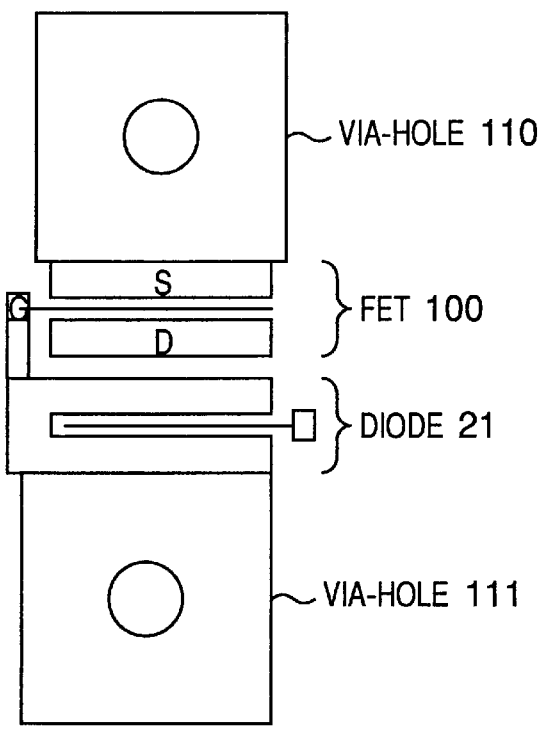
Fig.13A    Fig.13B
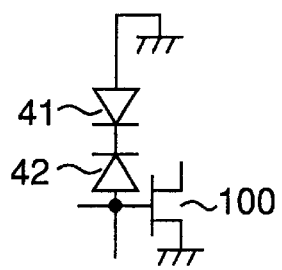
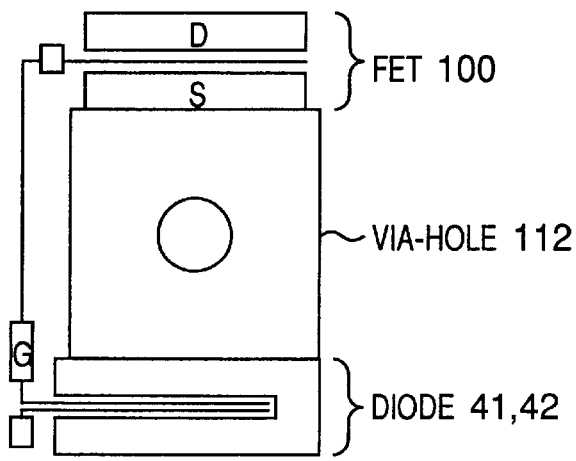

PHASE CORRECTION CIRCUIT FOR TRANSISTOR USING HIGH-FREQUENCY SIGNAL

FIELD OF THE INVENTION

The present invention relates to a phase correction circuit for a transistor using a high-frequency signal, which is used for a radio communication device, for example.

BACKGROUND OF THE INVENTION

It has been well known to those skilled in the art that a threshold voltage $V_{TH}$ of a gate of a transistor is increased by an increase in the temperature of the transistor. If the threshold voltage $V_{TH}$ has been increased, a high-level voltage of a control signal supplied to the gate needs to increase up to a value corresponding to the increased threshold voltage $V_{TH}$, so that the transistor can work correctly. Otherwise, other circuits provided on the downstream side of the transistor and using an output signal of the transistor cannot work correctly.

In order to solve the problem, a temperature compensation circuit has been proposed so far. The circuit supplies a compensation voltage which increases together with the increase in temperature of the transistor, so that the transistor can work correctly, even if the high-level voltage of the control signal is fixed irrelevant to its temperature change.

FIG. 14 shows a depletion type n-channel field effect transistor 100 of which a gate is connected to not only a control signal line but also a temperature compensation circuit 10. A threshold voltage $V_{TH}$ of the transistor 100 is −1.5V. A drain of the transistor 100 is supplied with a voltage Vcc. A source of the transistor 100 is connected to the ground. Also, the drain of the transistor 100 is connected to a high-frequency circuit 200.

The temperature compensation circuit 10 functions as a potential dividing circuit. The circuit 10 has a load circuit 11 and a resistor 12 connected in series to the load circuit 11. The joint P1 between the load circuit 11 and the resistor 12 is connected to the gate of the transistor 100. More particularly, the load circuit 11 has three diodes 11a, 11b and 11c, connected in series and supplied with a forward bias. A terminal 13 beside the load circuit 11 is supplied with Vg1=−1v. A terminal 14 beside the resistor 12 is supplied with Vg2=−5v. A resistance Rd of the load circuit 11 is increased by a temperature increase. This is caused by a well-known temperature characteristic of the diode being supplied with forward bias, i.e., each resistance of the forward biased diode 11a, 11b and 11c is increased by the temperature increase.

A potential of the joint P1, or a compensation voltage being supplied to the gate of the transistor 100 is increased by an increase in resistance Rd of the load circuit 11 with the temperature increase. An incremental ratio of the compensation voltage for the temperature increase is determined identically to that of the threshold $V_{TH}$ of the transistor 100 for the temperature increase. Therefore, the transistor 100 can work correctly, even if the high-level voltage control signal is not changed with the increase in temperature of the transistor 100.

As described above, the temperature compensation circuit 10 can supply the compensation voltage increasing together with the increase in temperature of the transistor 100 to the gate of the transistor 100. If the transistor 100 having the temperature compensation circuit 10 is used as a transistor for a high-frequency circuit, it causes a problem that a phase of output signal from the transistor 100 is shifted together with the increase in supply voltage, because a depletion capacitance increases together with the increase in supply voltage. If an amount of phase shift is increased, a following high-frequency circuit 200 can not work correctly.

As the phase correction circuit for a transistor using a high-frequency signal, several circuits have been proposed in various documents: a phase temperature compensation high frequency amplifier in JP A 03-258008, a semiconductor device and amplifier in JP A 11-74367, and a peaking circuit in JP A 01-137713, for example.

The phase temperature compensation high frequency amplifier in JP A 03-258008 has a circuit functioning as a phase correction circuit. The circuit has a varactor diode and a potential dividing circuit, adjusting a supply voltage of the varactor diode. The potential dividing circuit uses a positive thermistor having a resistance varying with its temperature. It is well known by those skilled in the art that the relationship of the capacitance of the varactor diode to the supply voltage is determined by a state of a p-n junction. That is, at the step junction, the depletion capacitance of the varactor diode changes in simple proportion to the square root of the supply voltage. In addition, at the graded junction, the depletion capacitance of the varactor diode changes in inverse proportion to the cube root of the supply voltage. On the contrary, the depletion capacitance of the transistor changes in simple proportion to the increase of its temperature. Therefore a compensated phase does not indicate any constant value in relation to its temperature change, or cannot have a linear relationship as described in JP A 03-258008. In addition, the semiconductor chip size becomes large because the amplifier needs to include not only the varactor diode but also a potential dividing circuit.

The semiconductor device and amplifier in JP A 11-74367 uses a diode that is inverse connected to another diode in an equivalent circuit of a transistor. The circuit supplies an inverse bias to the inverse connected diode. An electric potential of the inverse bias is set the same potential of the diode in the equivalent circuit. Therefore the capacitance changes of each of the diodes are canceled and therefore secondary unsymmetrical wave distortion can be removed. Nevertheless, this circuit cannot correct a phase shift caused by the increase in threshold voltage. In addition, JP A 11-74367 fails to disclose any circuit to correct a phase shift being caused by the temperature increase.

The peaking circuit in JP A 01-137713 can adjust a phase of an output signal from a transistor by means of a side-gate at a constant environment temperature. However, the circuit is not constructed to correct a phase shift caused by the increase in threshold voltage $V_{TH}$ due to the temperature increase. Also, in this third document, there is no description of a circuit to correct a phase shift caused by the temperature increase. In addition, the compensation circuit described in the third document is an only circuit to cancellation an influence from the side-gate.

SUMMARY OF THE INVENTION

Therefore, a purpose of the present invention is to provide a phase correction circuit to stabilize a phase of an output signal of the transistor, even if its gate potential is increased by a temperature compensation function, the temperature increase and the other reasons.

To this end, the phase correction circuit for the transistor using high-frequency signal, comprising: a) a circuit element connected in parallel to a gate of the transistor together with a control signal line, an impedance including a reactance component of the circuit element being changed by a potential difference between an input terminal and an output terminal of the circuit element; and b) a voltage control circuit for adjusting a supply voltage to the circuit element to decrease the reactance component in response to an increase in potential of the gate, wherein a total value of reactance components of the circuit element and the transistor is set to a predetermined value, so that another circuit using an output of the transistor can work correctly.

In another aspect of the present invention, the circuit element may be a diode of which a cathode is connected to the gate of the transistor. In this case, the voltage control circuit supplies predetermined reverse bias to the diode.

In another aspect of the present invention, the circuit element may be a diode of which a cathode is connected directly or indirectly to the gate of the transistor and a transmission line connected in series to the anode or cathode of the diode. In this case, the voltage control circuit supplies predetermined reverse bias to the diode.

In another aspect of the present invention, the circuit element may be two diodes of that the cathodes connected each other. One anode of the two diodes is connected to the gate of the transistor. In this case, the voltage control circuit supplies predetermined reverse bias to another anode of the two diodes.

BRIEF DESCRIPTION OF THE DRAWINGS

FIG. 12A is a partial circuit diagram showing the phase correction circuit of the first embodiment;

FIG. 12B is a diagram showing a partial layout pattern of the phase correction circuit of the first embodiment;

FIG. 13A is a partial circuit diagram showing the phase correction circuit of the third embodiment;

FIG. 13B is a diagram showing a partial layout pattern of the phase correction circuit of the third embodiment.

DETAILED DESCRIPTION OF THE PREFERRED EMBODIMENTS

Figure 1:
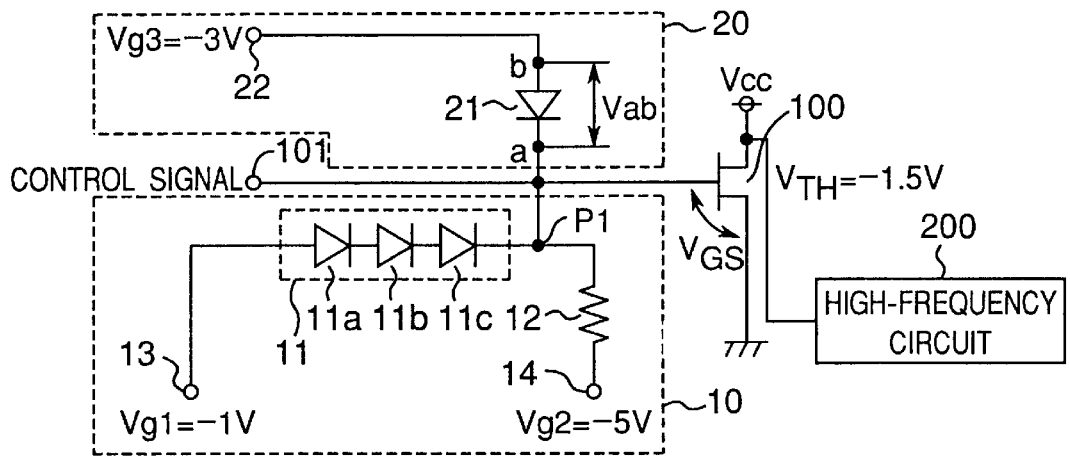
FIG. 1 is a circuit diagram showing a phase correction circuit of a first embodiment.

With reference to the drawings, several embodiments of the present invention will be described in detail hereinafter. It should be noted that like reference numerals designate like parts throughout the drawings.

FIRST EMBODIMENT

Figure 2:
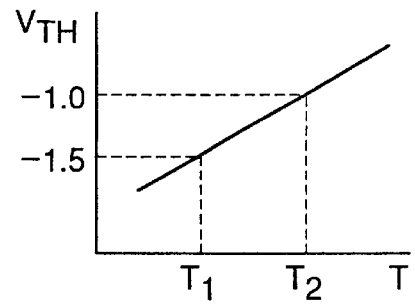
FIG. 2 is a temperature characteristic diagram of the threshold $V_{TH}$.

FIG. 1 shows a transistor 100 for high-frequency signal of which a gate is connected to not only a control signal line but also a well-known temperature compensation circuit 10 and a phase correction circuit 20. The transistor 100 is a depletion type n-channel field effect transistor and its threshold $V_{TH}$ is −1.5V at a temperature T1. A drain of the transistor 100 is supplied with a supply voltage Vcc. A source of the transistor 100 is connected to a ground. Also, a drain of the transistor 100 is connected to a high-frequency circuit 200. As shown in FIG. 2, the threshold $V_{TH}$ of the transistor 100 increases from −1.5V to −1.0V when the transistor's temperature increases T1 to T2.

Before a detail explanation about the phase correction circuit 20 is described, a simple explanation about the temperature compensation circuit 10 will be made.

The temperature compensation circuit 10 functions as a potential dividing circuit. The circuit 10 has a load circuit 11 and a resistor 12 connected in series to the load circuit 11. A joint P1 between the load circuit 11 and the resistor 12 is connected to the gate of the transistor 100. More particularly, the load circuit 11 has three diodes 11a, 11b and 11c connected in series and supplied with forward bias. A terminal 13 beside the load circuit 11 is supplied with Vg1=−1V. A terminal 14 beside the resistor 12 is supplied with Vg2=−5V.

Figure 3:
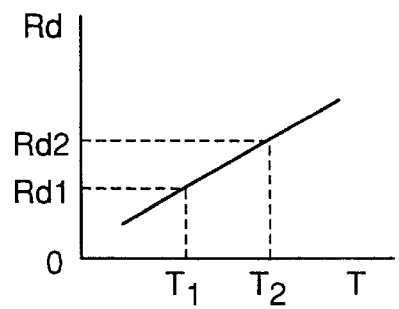
FIG. 3 is a temperature characteristic diagram of the resistance Rd.
Figure 4:
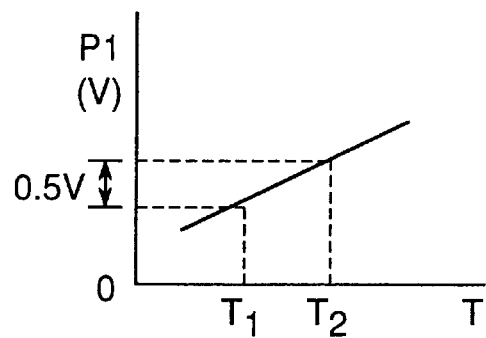
FIG. 4 is a temperature characteristic diagram of the potential voltage of the point P1.

As shown in FIG. 3, a resistance Rd of the load circuit 11 increases Rd1 to Rd2 together with an increase in temperature T1 to T2. Also, as shown in FIG. 4, a potential voltage of the point P1, or a compensation voltage being supplied to the gate of the transistor 100, increases by 0.5V in response to an increase in resistance Rd. The change ratio of the compensation voltage in the temperature increase is set to be substantially identical to that of the threshold $V_{TH}$ in the temperature increase. Therefore, the transistor 100 always can work correctly, even if the high-level voltage of the control signal does not changes by the temperature increase.

Figure 5:
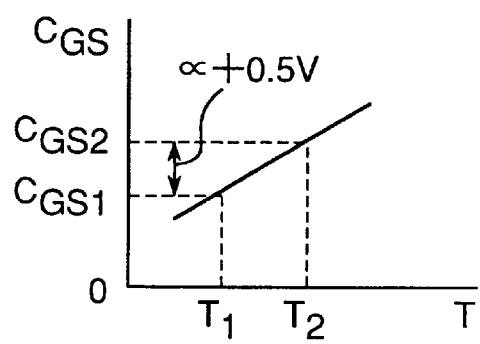
FIG. 5 is a temperature characteristic diagram of the depletion capacitance $C_{GS}$ of the transistor.

However, the temperature increase causes not only an increase in threshold $V_{TH}$ but also an increase in depletion capacitance. For example, when the compensation voltage (the potential voltage of the point P1) is increased by 0.5V, a depletion capacitance $C_{GS1}$ between the gate and the source of the transistor 100 is increased from $C_{GS1}$ to $C_{GS2}$ as shown in FIG. 5.

Figure 9:
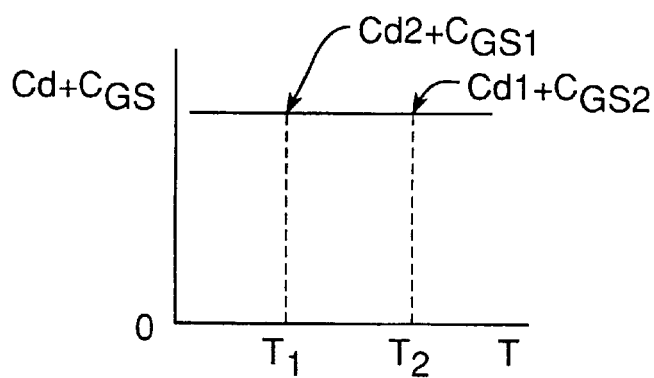
FIG. 9 is a temperature characteristic diagram of the capacitance $C_{GS}$+Cd.

The phase correction circuit 20 includes the reactance component Cd of its impedance to decrease inversely with the increase in depletion capacitance $C_{GS}$ caused by the temperature increase. Therefore, the total capacitance of $C_{GS}$ and Cd approaches to a substantially constant value, as shown in FIG. 9.

The phase correction circuit 20 is connected to the gate of the transistor 100 together with the control signal line. The phase correction circuit 20 has a diode 21 as a circuit element of which a reactance component of its impedance is varied by a potential difference of between an input terminal and an output terminal of the diode 21.

A cathode of the diode 21 is connected with the gate of the transistor 100. An anode of the diode 21 is connected with the voltage-supplying terminal 22. The voltage terminal 22 is supplied with Vg3=−3V. Therefore, a potential of the gate is always higher than a potential of the terminal 22.

The phase correction circuit 20 having diode 21 and the terminal 22, functioning as a voltage control circuit, adjusts potential difference between the input terminal and the output terminal of the diode 21 in order to decrease a reactance component of the diode 21 in accordance with an increase in potential of the gate of the transistor 100.

The depletion capacitance Cd of the diode 21 decreases inversely with the increase in potential of the gate of the transistor 100 in order that the total capacitance of $C_{GS}$ and Cd reaches a substantially constant value, so that the following high-frequency circuit 200 using an output signal of the transistor 100 can function correctly.

Figure 6:
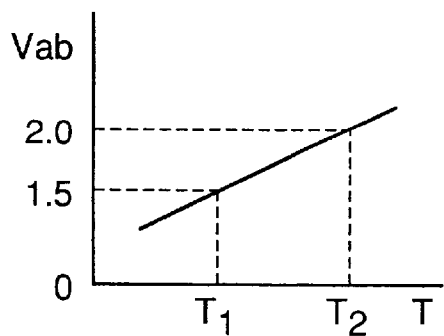
FIG. 6 is a temperature characteristic diagram of the potential voltage of $V_{ab}$.

FIG. 6 shows a temperature characteristic diagram of a potential difference Vab between a terminal-a and a terminal-b of the diode 21. The potential difference Vab increases from 1.5V to 2.0V in response to the increase in temperature from T1 to T2 (T2>T1). This change is caused by an increase in voltage supplied to the gate of the transistor 100. This voltage increment is caused by a function of a temperature compensation circuit 10 with the temperature increase.

Figure 7:
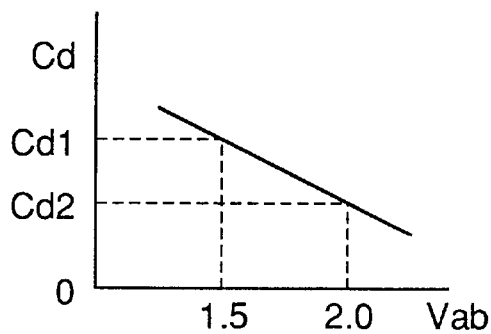
FIG. 7 is a characteristic of the depletion capacitance Cd of the diode in relation to the potential voltage $V_{ab}$.

FIG. 7 shows a character of the depletion capacitance Cd to the potential difference Vab. The depletion capacitance Cd decreases from Cd2 to Cd1 (Cd1<Cd2) in response to the increase in potential difference Vab. This change is caused by a well-known character of an inverse connected and inverse biased pin diode.

Figure 8:
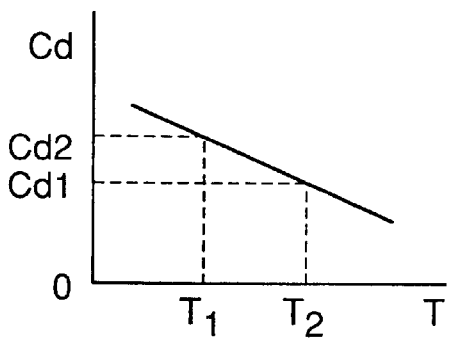
FIG. 8 is a temperature characteristic diagram of the depletion capacitance Cd of the diode.

FIG. 8 shows a temperature characteristic diagram of the depletion capacitance Cd. The depletion capacitance Cd decreases from Cd2 to Cd1 in response to the increase in temperature from T1 to T2 (T2>T1). This change is caused by the increase in temperature from T1 to T2 (T2>T1) due to the function of the temperature compensation circuit 10 with the temperature increase.

FIG. 9 shows a temperature characteristic diagram of the total capacitance of Cd and $C_{GS}$. The total capacitance of Cd and $C_{GS}$ is maintained constant irrelevant to the temperature. This can be attained by the set of an appropriate diode 21 of which a temperature characteristic of depletion capacitance Cd has an inverse temperature characteristic of depletion capacitance $C_{GS}$ of the transistor 100.

The phrase of "The total capacitance of Cd and $C_{GS}$ shows a constant value" means that a phase shift caused by the total capacitance of Cd and $C_{GS}$ provides no adverse affect to the high-frequency circuit 200. Also, this definition of "the total capacitance of Cd and $C_{GS}$ shows a constant value" can be used in each phase correction circuits 20,30 in the following embodiments.

In an embodiment of semiconductor circuit having the transistor 100 of which the gate is connected with the temperature compensation circuit 10 and the phase correction circuit 20, a size of the semiconductor circuit can be reduced, in compared with another semiconductor circuit using the transistor 100 connected with the circuit 10 and an adjusting means for adjusting the phase of the output signal of the transistor 100, because the phase correction circuit 20 has a simple construction. Specifically, the circuit 20 has one diode 21 and two lines supplying an inverse bias that varies with a voltage of the gate of the transistor 100 to the diode 21. However, in the case where the transistor 100 connected with the circuit 10 and the adjusting means are used for the semiconductor circuit, the adjusting means need two complex circuits. One circuit is a detecting circuit for detecting a reference signal and an amount of a phase shift, and another circuit is an adjusting circuit for adjusting a shifted signal according to the reference signal. Each phase correction circuit 30,40 in the following embodiments described below can also reduce the semiconductor circuit size by similar reasons.

SECOND EMBODIMENT

Figure 10:
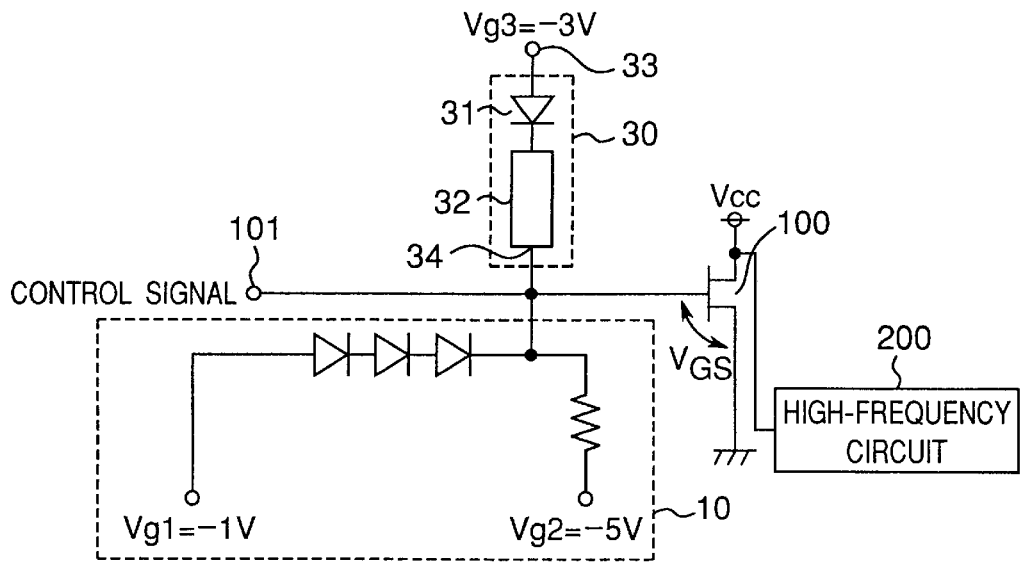
FIG. 10 is a circuit diagram showing a phase correction circuit of a second embodiment.

FIG. 10 shows a transistor 100 of which the gate is connected with the temperature compensation circuit 10 and a phase correction circuit 30. The drain of the transistor 100 is supplied with Vcc. The source of the transistor 100 is connected to a ground. Also, the drain of the transistor 100 is connected to the high-frequency circuit 200.

The phase correction circuit 30 uses a loaded line type phase device as a circuit element which is connected in parallel to the gate of the transistor 100 together with a control signal line, and of which an impedance including reactance component is changed by the potential difference between its input and output terminals. The loaded line type device has a diode 31 and a transmission line 32. A cathode of the diode 31 is turned to the gate of the transistor 100. The transmission line 32 is connected serially to the diode 31.

Also, in the phase correction circuit 30, a terminal 34 of the transmission line 32 is connected to the gate of the transistor 100. A terminal 31 of an anode of the diode 31 is supplied with Vg3=−3V. Therefore, the circuit 30 can function as a voltage control circuit that can adjust the supply voltage to the diode 31 in order to decrease the reactance component according to the increase in potential of the gate of the transistor 100.

The phase correction circuit 30 of second embodiment has not only a phase correctable function effected by a diode 21 of the phase correction circuit 20 of first embodiment but also an additional phase correctable function effected by a reactance component of the transmission line 32. Therefore, the phase correction circuit 30 can adjust flexibly a phase of an output signal of the transistor 100 to a request of the high-frequency circuit 200.

It should be noted that, a connecting order of the diode 31 and the transmission line 32 is replaceable.

THIRD EMBODIMENT

Figure 11:
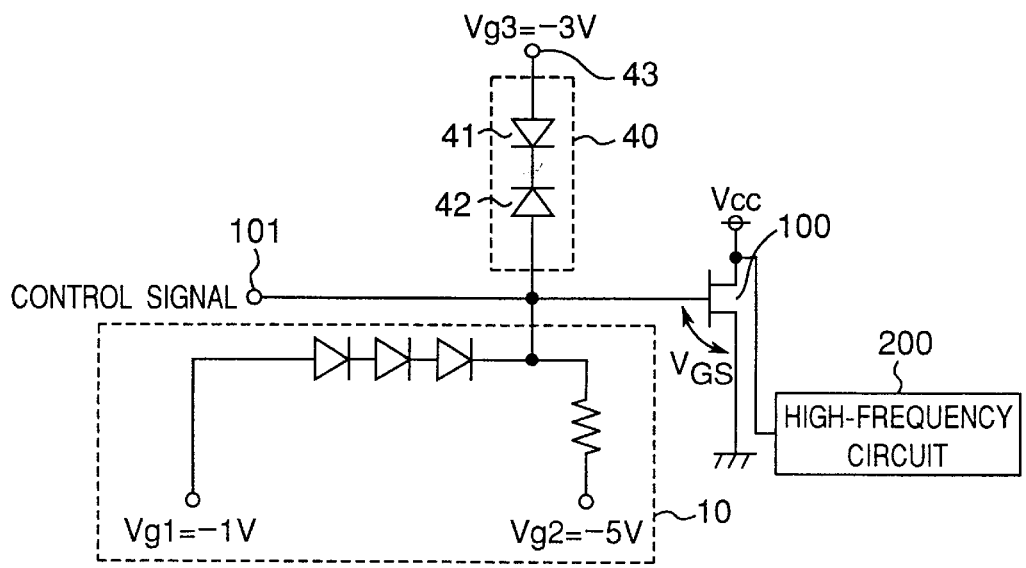
FIG. 11 is a circuit diagram showing a phase correction circuit of a third embodiment.
Figure 14:
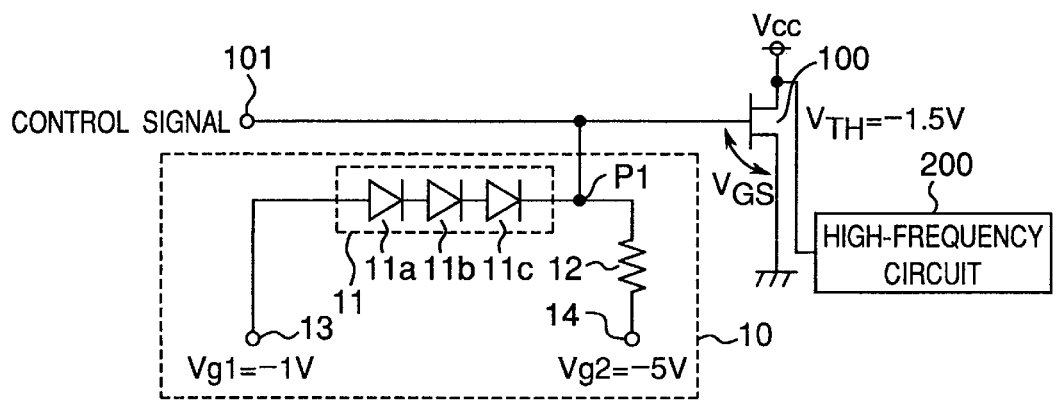
FIG. 14 is a circuit diagram showing a transistor with a well-known temperature compensation circuit.

FIG. 11 shows the transistor 100 of which the gate is connected not only to the control signal line but also to the temperature compensation circuit 10 and a phase correction circuit 40 of third embodiment. The drain of the transistor 100 is supplied with power supply Vcc. The source of the transistor 100 is connected to a ground. Also, the drain of the transistor 100 is connected to the high-frequency circuit 200.

The phase correction circuit 40 uses two diodes 41,42 of which cathodes are connected to each other to form a circuit element which is connected in parallel to the gate of the transistor 100 together with a control signal line, and of which the impedance including reactance component is changed by the potential difference between its input and output terminals. Because both cathodes of the diodes 41,42 are formed into a single unit in a semiconductor circuit, a size of layout pattern can be reduced.

Also, in the phase correction circuit 40, an anode of the diode 42 is connected to the gate of the transistor 100. A terminal 43 of the anode of the diode 41 is supplied with Vg3=−3V in order to set a potential of the gate of the transistor 100 higher than a potential of the terminal 43. Therefore, the circuit 40 can work as a voltage control circuit which adjusts the supply voltage to the diode 41 in order to decrease the reactance component in accordance with the increase in potential of the gate of the transistor 100.

FIG. 12A shows a connecting phase of the diode 21 of the phase correction circuit 20 of first embodiment and the transistor 100. FIG. 12B shows a layout pattern of the connecting phase. As shown in FIG. 12B, in the phase correction circuit 20, two via-holes 110,111 are needed in the layout pattern.

FIG. 13A shows a connecting phase of the diodes 41,42 of the phase correction circuit 40 of the third embodiment and the transistor 100. FIG. 13B shows a layout pattern of the connecting phase. As shown in FIG. 13B, since the cathodes of the diodes 41,42 are made with a single unit, only one via-hole 112 is needed in the layout pattern.

Comparing with two layout patterns in FIG. 12B and FIG. 13B, it can be understood that the phase correction circuit 40 could be reduced in size corresponding to one via-hole.

As described above, the phase correction circuits 20,30 and 40 according to the embodiments 1,2 and 3 can stabilize the phase shift of the output signal of the transistor 100 by maintaining the total capacitance of Cd and $C_{GS}$ in the predetermined constant value, even if the supply voltage to the gate of the transistor 100 is increased by, for example, the function of the temperature compensation circuit 10, so that the following circuit using the output signal of the transistor 100 can work correctly.

What is claimed is:

1. A phase correction circuit for a transistor, comprising:

a circuit element having an output terminal connected to a gate of a transistor to which a control signal line is connected, and an input terminal, wherein the circuit element has a reactance that changes with potential difference between the input terminal and the output terminal; and a voltage control circuit supplying a voltage to the input terminal of the circuit element so that the reactance of the circuit element decreases in response to an increase in potential of the gate, wherein a sum of the reactance of the circuit element and a gate-source reactance of the transistor remains substantially constant.

2. The phase correction circuit according to claim 1, wherein the circuit element is a diode having an anode as the input terminal and a cathode as the output terminal, the cathode of the diode is connected to the gate of the transistor, and the voltage control circuit supplies a reverse bias to the anode of the diode.

3. The phase correction circuit according to claim 1, wherein the circuit element includes a diode having an anode as the inputs terminal and a cathode as the output terminal, the cathode being connected directly, or indirectly to the gate of the transistor, and including a transmission line serially connected to one of the anode and cathode of the diode, wherein the voltage control circuit supplies a reverse bias to the anode of the diode.

4. The phase correction circuit according to claim 1, wherein the circuit element includes first and second diodes having respective anodes and cathodes, the cathodes are connected to each other, the anode of the first diode is the output terminal connected to the gate of the transistor and, the voltage control circuit supplies a reverse bias to the anode of the second diode as the input terminal.

* * * * *